United States Patent [19]
Schreck et al.

[11] Patent Number: 5,287,310
[45] Date of Patent: Feb. 15, 1994

[54] MEMORY WITH I/O MAPPABLE REDUNDANT COLUMNS

[75] Inventors: John F. Schreck; Phat C. Troung, both of Houston, Tex.

[73] Assignee: Texas Instruments Incorporated, Dallas, Tex.

[21] Appl. No.: 57,405

[22] Filed: May 6, 1993

Related U.S. Application Data

[63] Continuation of Ser. No. 594,531, Oct. 9, 1990, abandoned.

[51] Int. Cl.[5] .............................................. G11C 7/00
[52] U.S. Cl. ................................ 365/189.05; 365/185; 365/200; 365/189.02; 365/230.03; 371/10.3
[58] Field of Search .................. 365/200, 185, 189.05, 365/230.02, 230.03, 189.02; 371/10.3

[56] References Cited

U.S. PATENT DOCUMENTS

| | | | |
|---|---|---|---|
| 4,601,019 | 7/1986 | Shah et al. | 365/200 |
| 4,604,730 | 8/1986 | Yoshida et al. | 365/200 |
| 4,807,056 | 3/1989 | Furutani et al. | 365/200 |
| 4,849,938 | 7/1989 | Furutani et al. | 371/10.3 |
| 5,043,943 | 8/1991 | Crisp et al. | 365/200 |

Primary Examiner—Joseph E. Clawson, Jr.
Attorney, Agent, or Firm—W. James Brady; Leo N. Heiting; Richard L. Donaldson

[57] ABSTRACT

A byte-wide memory has a plurality of redundant columns. Each redundant column is capable of being mapped to any one of a plurality of input buffers and output buffers in place of a defective column. Fuse match logic circuits store the addresses of defective columns. I/O fuse decoder circuits are coupled to the fuse match logic circuits and store information identifying the input and output buffers associated with each defective column. The redundant columns are selected in response to a portion of the column address signals which select nonredundant columns. When a received column address matches a stored column address, the redundant column selected by the portion of column address signals is mapped to the input and output buffer associated with the defective column in place of the defective column.

5 Claims, 12 Drawing Sheets

ADDRESS INPUT

| PRE DECODER | | | | | | |
|---|---|---|---|---|---|---|
| PROGRAM PATH | | | | | | |
| REDUNDANT ROWS | WORDLINE DECODER AND DRIVERS | R E D U N D A N T | C O L U M N S | REDUNDANT ROWS | REDUNDANT ROWS | WORDLINE DECODER AND DRIVERS | REDUNDANT ROWS |
| 512x512 MEMORY CELL ARRAY | | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | R E D U N D A N T | C O L U M N S | 512x512 MEMORY CELL ARRAY | 512x512 MEMORY CELL ARRAY | WORDLINE DECODER AND DRIVERS | 512x512 MEMORY CELL ARRAY |
| 512x512 MEMORY CELL ARRAY | | R E D U N D A N T | C O L U M N S | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | R E D U N D A N T | C O L U M N S | 512x512 MEMORY CELL ARRAY | 512x512 MEMORY CELL ARRAY | WORDLINE DECODER AND DRIVERS | 512x512 MEMORY CELL ARRAY |
| VIRTUAL GROUND DECODER | COLUMN DECODER | | | VIRTUAL GROUND DECODER | VIRTUAL GROUND DECODER | COLUMN DECODER | VIRTUAL GROUND DECODER |
| SENSE AMPS | | | | SENSE AMPS | SENSE AMPS | | SENSE AMPS |

DATA INPUT/OUTPUT

*FIG. 1*

MEMORY WITH I/O MAPPABLE REDUNDANT COLUMNS

This application is a continuation of application Ser. No. 07/594,531, filed Oct. 9, 1990 now abandoned.

BACKGROUND OF THE INVENTION

This invention relates to semiconductor memory devices. More particularly, this invention relates to a byte-wide semiconductor memory device having redundant columns which are mappable to input and output buffers at any one of a plurality of bit positions.

Semiconductor memory devices are often provided with redundant columns to improve manufacturing yields. The redundant columns can be programmed to replace columns having defective cells thus permitting the use of a memory device which would otherwise have to be discarded. For byte-wide semiconductor memory devices, that is devices which can input or output plural bits of data simultaneously, it is desirable that redundant columns be capable of replacing defective columns at any bit position.

One method of implementing column redundancy in a byte-wide memory device is to add a single redundant column to each bit position. In such a scheme, each redundant column can replace only a single defective column in the plurality of columns associated with that particular bit position. This technique consumes a great deal of space and is inefficient since it is highly unlikely that a defective column will be associated with each bit position. In addition, this technique is incapable of repairing memory devices having more than one defective column associated with a single bit position.

Another technique for providing column redundancy in a byte-wide memory device is described in U.S. Pat. No. 4,601,019 to Shaw et al. According to the technique described in that patent, each redundant column can be substituted for any defective column in half of an array regardless of the bit position at which the defective column is located. A separate redundancy select circuit is connected to each redundant column and stores address information corresponding to a single defective column. When a match occurs between an externally received column address and a defective column address stored in one of the redundancy select circuits, the redundant column connected to that redundancy select circuit is substituted for the defective column. Although more efficient than the previously described technique, the fact that each redundant column has a separate redundancy select circuit requires more space and a layout which is more complex than desirable.

Accordingly a need exists for a byte-wide memory device having redundant columns and associated control circuitry which require a minimum of space in which the redundant columns are capable of being mapped to any input and output buffer in order to replace defective columns at any bit position.

SUMMARY OF THE INVENTION

In accordance with the present invention, there is provided a memory having an array of memory cells arranged in a plurality of rows and columns. The columns are arranged in a plurality of groups and for each group a decoder circuit selects a single column in the group in response to a column address signal. The memory also includes a plurality of redundant columns and a column decoder for selecting a single redundant column in response to at least a portion of the column address signal. A plurality of input buffers and output buffers are provided with each input buffer and output buffer being associated with the columns in at least one group of columns. The memory includes a plurality of switching means, each switching means associated with an input and an output buffer and coupling either a selected column to its associated input buffer and its associated output buffer in response to first control signals or a selected redundant column to its associated input buffer and its associated output buffer in response to second control signals. Control circuitry stores the addresses of defective columns and information identifying the input and output buffers associated with each defective column and supplies first control signals to all of the switching means when a received column address signal does not match a stored address and supplies second control signals to the switching means associated with a defective column and first control signals to the remaining switching means when a received column address matches a stored address.

BRIEF DESCRIPTION OF THE DRAWINGS

The novel features of this invention are set forth in the appended claims. The invention, its features, and its advantages are described below in conjunction with the following drawings:

FIG. 1 is a representation of an integrated circuit layout for a four megabit EPROM array.

FIG. 5 is an electrical schematic diagram of a sense amplifier/program circuit of FIG. 3a.

FIG. 6 is an electrical schematic diagram of the redundant sense amplifier/program circuit of FIG. 3a.

FIGS. 7 is an electrical schematic diagram of the sense amplifier decoder of FIG. 3a.

DETAILED DESCRIPTION OF THE DRAWINGS

Referring to FIG. 1, an example of an integrated circuit layout for a nominal four megabit EPROM is illustrated. The layout, in which dimensional proportions are not those of actual manufacture, illustrates sixteen 512 by 512 memory sub-arrays with redundant rows and columns used to replace rows and columns having defective cells. Peripheral circuitry, including row decoders, column decoders, virtual-ground decoders, wordline drivers, and column/segment pass gates, functions to connect reading and programming voltages to the rows and columns of cells in response to address inputs routed through a pre-decoder and program path. Data are written into the memory arrays during programming operations. During reading operations, data from the memory arrays are routed through sense amplifiers to the output.

Figure 2:
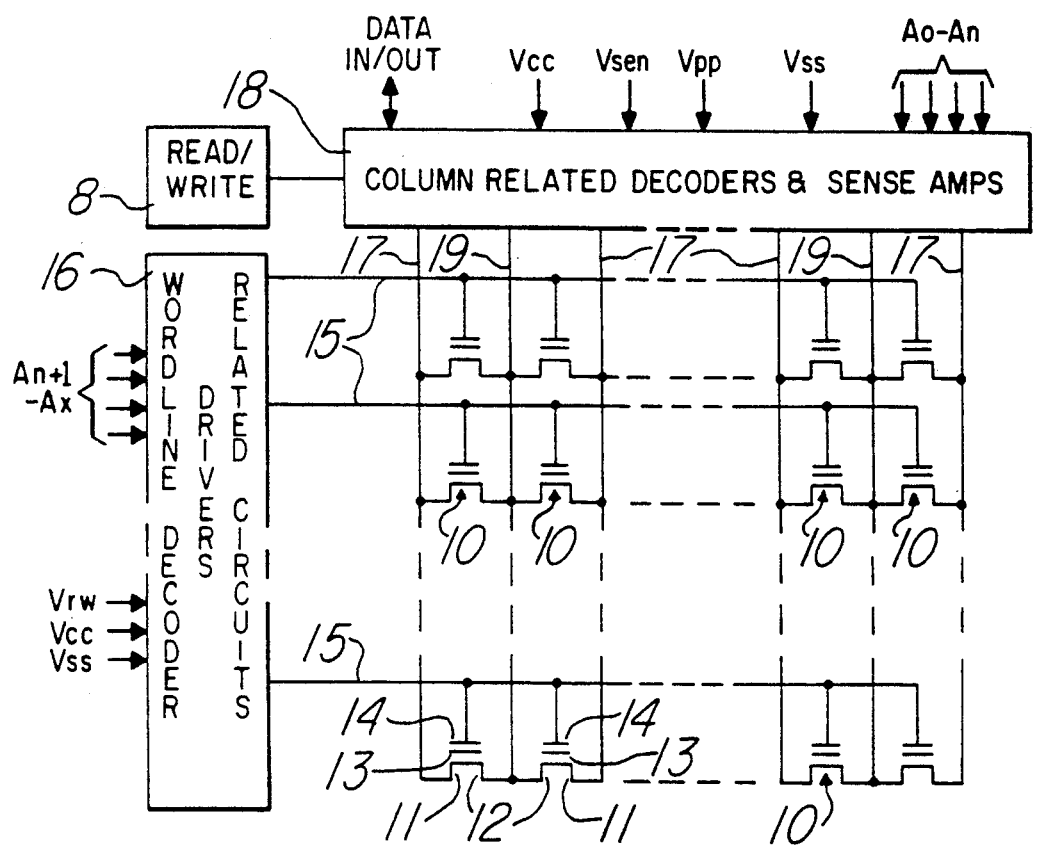
FIG. 2 is a representation of a part of a memory cell array and associated circuitry of the integrated circuit of FIG. 1.

Referring to FIG. 2, an example array of memory cells, which is a part of a memory chip such as that illustrated in FIG. 1, is shown. Each cell 10 is a floating gate transistor having a source 11, a drain 12, a floating gate 13 and a control gate 14. Each of the control gates 14 in a row of cells 10 is connected to a wordline 15, and each of the wordlines 15 is connected to a row decoder circuit 16. Each of the sources 11 in a column of cells 10 is connected to a source-column line 17 (which may be a virtual ground line), and each of the source-column lines 17 is connected to a column decoder circuit 18. Each of the drains 12 in a column of cells 10 is connected to a drain-column line 19, and each of the drain-column lines 19 is connected to the column decoder circuit 18.

In a write or program mode, row decoder circuit 16, in response to wordline address signals $A_{n+1}-A_x$ and to signals from read/write control circuit 8, places a first preselected programming voltage Vpp (approximately +12.5 volts) on a selected wordline 15, including a control gate 14 of a selected memory cell 10. Column decoder circuit 18, in response to bitline address signals $A_0-A_n$ and to signals from read/write control circuit 8, places a second programming voltage Vrw (which may be Vpp reduces through an impedance to approximately +5 to +10 volts) on a selected source-column line 17 and, therefore, the source region 11 of the selected cell 10. Column decoder circuit 18 also connects a selected drain-column line 19 to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 volts to −6 volts with respect to the channel region. The injected electrons and negative program charge in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, row decoder circuit 16, in response to wordline address signals $A_{n+1}-A_x$ and to signals from read/write control circuit 8, applies a preselected positive voltage Vcc (approximately +3 volts to +5 volts) to the selected wordline 15 and thus to the selected control gate 14, and applies a low voltage (ground or Vss) to deselected wordlines 15. The column decoder circuit 18, in response to column address signals $A_0-A_n$ and to signals from read/write control circuit 8, applies a positive voltage Vsen (approximately +1 volt to +1.5 volts) to the selected drain-column line 19. Column decoder circuit 18 also connects all of the source-column lines 17 to ground or reference potential Vss except for the source-column line 17 sharing the same drain-column line connected to the cell 10 that is being read. That source-column line 17 is driven to the same voltage level as the selected drain-column line 19.

As is well known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable for each mode of operation.

Figure 3A:
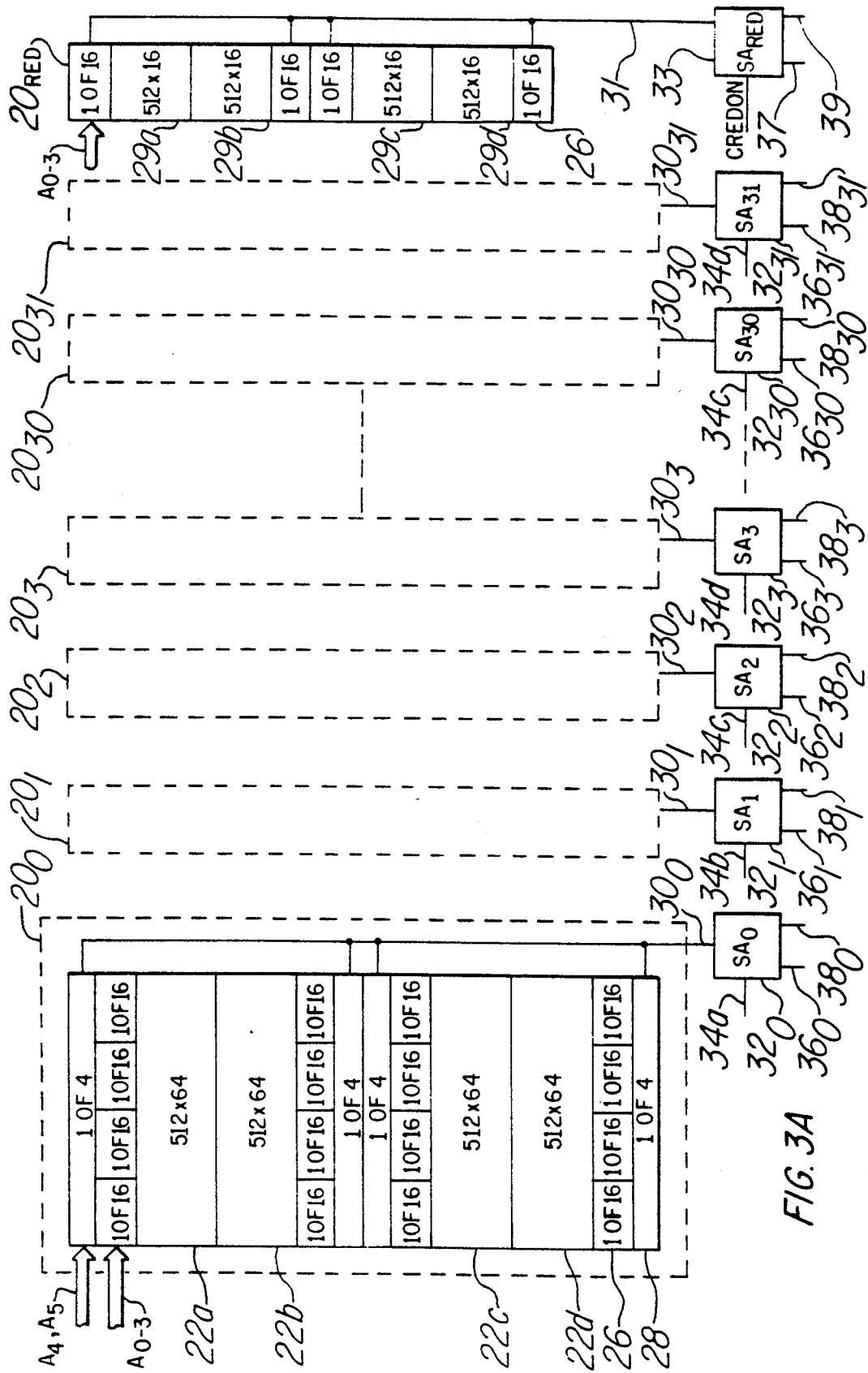
FIGS. 3a and 3b are block diagrams showing the circuits for implementing column redundancy.
Figure 3B:
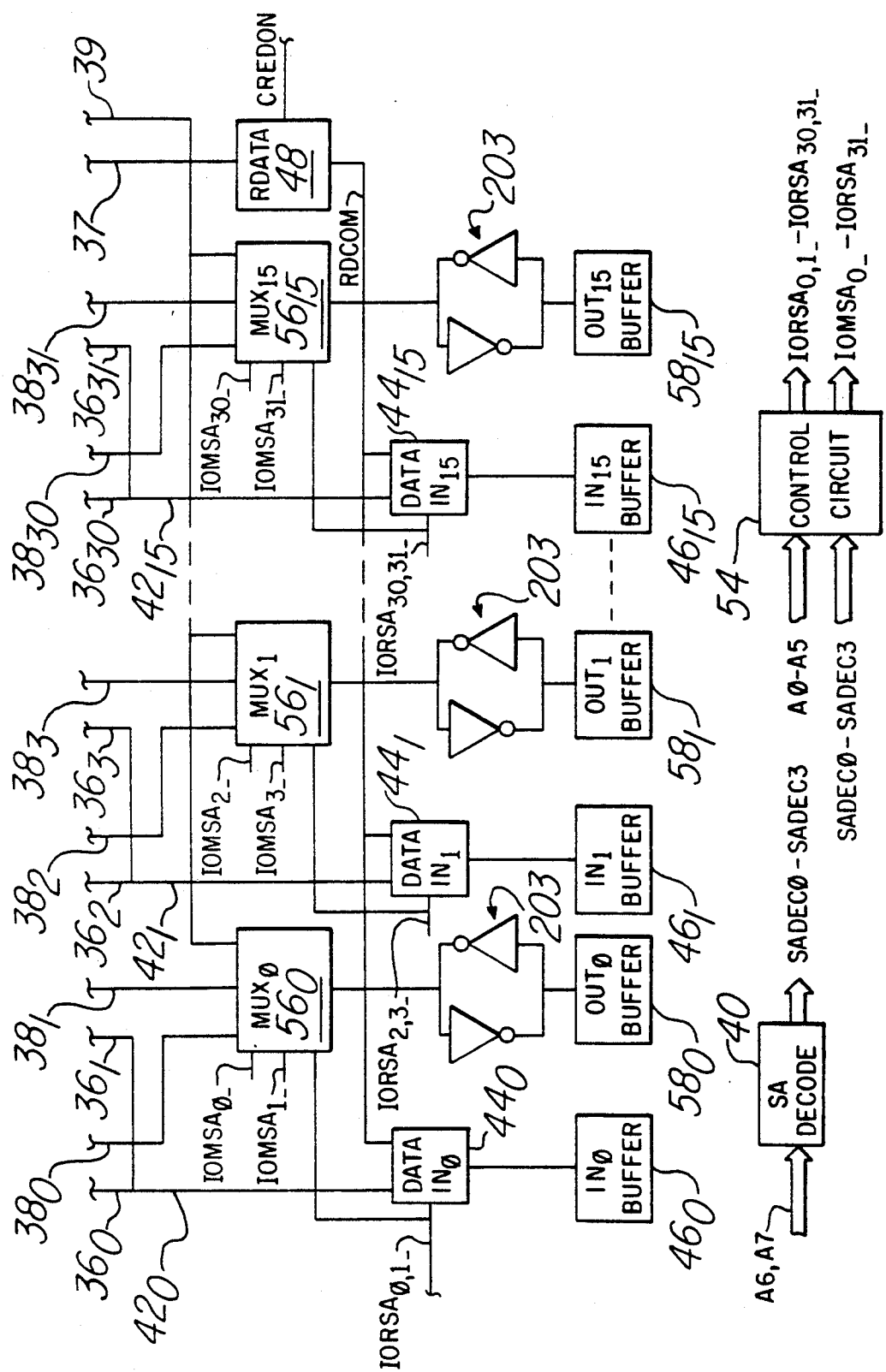

FIGS. 3a and 3b show in block diagram form the circuitry for implementing column redundancy in the EPROM of FIG. 1. Although row decoding circuitry is not shown for ease of understanding, it is understood that the row decoding circuitry would select a single one of the 2,048 wordlines in each column of four 512 row by 512 column subarrays in response to row address signals A8–A18.

As seen in FIG. 3a, each of the four columns of four 512 row by 512 column memory cell subarrays is divided into eight sections 20, for a total of 32 sections $20_0-20_{31}$. Each of the sections $20_0-20_{31}$ includes four 512 row by 64 column memory cell subarray portions 22a–22d. For each of the portions 22a–22d, 1 of 64 column decoding is performed using four 1 of 16 decoders 26 and a 1 of 4 decoder 28. Each decoder 26 is connected to 16 of the 64 columns of memory cells in an associated portion and selects one of the 16 columns in response to address signals A0–A3. Each decoder 28 is connected to the outputs of the four 1 of 16 decoders 26 and in response to address signals A4, A5 couples a selected one of the outputs of decoders 26 to one of lines $30_0-30_{31}$.

A section $20_{RED}$ of redundant columns of memory cells is also provided. Redundant section $20_{RED}$ includes four 512 row by 16 column memory cell subarray portions 29a–29d. Each memory cell subarray portion 29a–29d is connected to a 1 of 16 decoder 26 which couples a selected one of the 16 source-column lines to line 31 in response to address signals A0–A3. Each redundant column in section $20_{RED}$ is capable of being mapped or coupled to any of the pairs of input and output buffers ($46_0$ and $58_0$, $46_1$ and $58_1$, ..., $46_{15}$ and $58_{15}$) and is available to replace any one of the 128 columns in sections $20_0-20_{31}$ having the same A0–A3 address.

Each of the lines $30_0-30_{31}$ is connected to an associated one of sense amplifier/program circuits $32_0-32_{31}$. Sense amplifier/program circuits $32_0-32_{31}$ receive control signals SADEC0-SADEC3 from sense amplifier decoder 40 over lines 34a–34d. Every fifth one of the sense amplifier/program circuits 32 beginning with $32_0$ (i.e. $32_0$, $32_4$, $32_8$, ..., $32_{28}$) receives a control signal SADEC0 over line 34a. Every fifth one of the sense amplifier/program circuits beginning with $32_1$ (i.e. $32_1$, $32_5$, $32_9$, ..., $32_{29}$) receives a control signal SADEC1 over line 34b. Every fifth one of the sense amplifier/program circuits beginning with $34_2$ (i.e. $32_2$, $32_6$, $32_{10}$, ..., $32_{30}$) receives a control signal SADEC2 over line 34c. Every fifth one of the sense amplifier/program circuits beginning with $32_3$ (i.e. $32_3$, $32_7$, $32_{11}$, ..., $32_{31}$) receives a control signal SADEC3 over line 34d. Sense amplifier/program circuits $32_0-32_{31}$ are enabled in response to control signals SADEC0-SADEC3 having a logic "1" level to couple data received on input lines $36_0$-$36_{31}$ to lines having a logic "0" level to prevent coupling of data received on input lines $36_0$-$36_{31}$ to lines $30_0$-$30_{31}$.

Control signals SADEC0-SADEC3 are produced by sense amplifier decoder 40 in response to address signal A6 when the EPROM is in a by 16 (16 bit) configuration or in response to address signals A6, A7 when the EPROM is in a by 8 (8 bit) configuration. When operating in a by 16 configuration, one of control signals SADEC0 and SADEC1 and one of control signals SADEC2 and SADEC3 will have a logic "1" level to enable a single one of each adjacent pair of sense amplifier/program circuits $32_0$ and $32_1$, $32_2$ and $32_3$, ..., and $32_{30}$ and $32_{31}$. For example, when address signal A6 has a logic "0" level, control signals SADEC0 and SADEC2 have logic "1" levels enabling sense amplifier/program circuits $32_0$, $32_2$, ..., $32_{30}$ and control signals SADEC1 and SADEC3 have logic "0" levels. When address signal A6 has a logic "1" level, control signals SADEC1 and SADEC3 are at a logic "1" level enabling sense amplifier/program circuits $32_1$, $32_3$, ..., $32_{31}$ and control signals SADEC0 and SADEC2 have logic "0" levels.

When operating in a by 8 configuration, only one of control signals SADEC0-SADEC3 will be a logic "1" level to enable a single one of each of four adjacent sense amplifier/program circuits $32_0$-$32_3$, $32_4$-$32_7$, ..., and $32_{28}$-$32_{31}$. For example, if address signals A6 and A7 have logic "0" levels, control signal SADEC0 has a logic "1" level and control signals SADEC1-SADEC3 have logic "0" levels. When address signals A6 and A7 have logic "1" and "0" levels, respectively, control signal SADEC1 has a logic "1" level and control signals SADEC0, SADEC2, and SADEC3 have logic "0" levels. When address signals A6 and A7 have logic "0" and "1" levels, respectively, control signal SADEC2 has a logic "1" level and control signals SADEC0, SADEC1, and SADEC3 have logic "0" levels. When address signals A6 and A7 have logic "1" levels, control signal SADEC3 has a logic "1" level and control signals SADEC0-SADEC2 have logic "0" levels.

Line 31 is connected to redundant sense amplifier/program circuit 33 which receives a control signal CREDON from control circuit 54. Redundant sense amplifier/program circuit 33 is enabled in response to control signal CREDON having a logic "1" level to couple data received on input line 37 to line 31 and disabled in response to control signal CREDON having a logic "0" level to prevent coupling of data received on input line 37 to line 31.

Data input lines $36_0$-$36_{31}$ of sense amplifier/program circuits $32_0$-$32_{31}$ are connected in pairs to lines $42_0$-$42_{15}$ which in turn are connected to data-in circuits $44_0$-$44_{15}$, respectively. Each of the data-in circuits $44_0$-$44_{15}$ is also connected to line 50. In the program mode, each data-in circuit $44_0$-$44_{15}$ selectively couples input data from input buffers $46_0$-$46_{15}$ to either line 42 in response to control signals IORSA0,1_-IORSA30,31_ received from control circuit 54 having logic "0" levels or to line 50 in response to control signals IORSA0,1_-IORSA30,31_ having logic "1" levels.

Redundant data-in circuit 48 selectively couples data received on line 50 to data input line 37 of redundant sense amplifier/program circuit 33 in response to control signal CREDON received from control circuit 54 having a logic "1" level and prevents coupling of data in response to control signal CREDON having a logic "0" level.

Data output lines $38_0$-$38_{31}$ of sense amplifier/program circuits $32_0$-$32_{31}$ are connected in pairs to output multiplexers $56_0$-$56_{15}$. Data output line 39 of redundant sense amplifier/program circuit 33 is also connected to each one of multiplexers $56_0$-$56_{15}$. The outputs of multiplexers $56_0$-$56_{15}$ are connected to output buffers $58_0$-$58_{15}$, respectively.

Multiplexers $56_0$-$56_{15}$ receive control signals IORSA0,1_-IORSA30,31_, respectively, from control circuit 54. Each multiplexer 56 couples redundant sense amplifier/program circuit 33 to output buffer 58 in response to a control signal IORSA_ having a logic "0" level and disconnects redundant sense amplifier/program circuit 33 from output buffer 58 in response to a control signal IORSA_ having a logic "1" level.

Multiplexers $56_0$-$56_{15}$ also receive pairs of control signals IOMSA0_ and IOMSA1_, IOMSA2_ and IOMSA3_, ..., IOMSA30_ and IOMSA31_, respectively, from control circuit 54. Control signals IOMSA0_-IOMSA31_ are associated with sense amplifier/program circuits $32_0$-$32_{31}$, respectively. Each multiplexer 56 couples a sense amplifier/program circuit 32 to output buffer 58 in response to the control signal IOMSA_ associated with that sense amplifier/program circuit 32 having a logic "0" level and disconnects that sense amplifier/program circuit 32 from output buffer 58 in response to that control signal IOMSA_ having a logic "1" level.

To implement column redundancy, columns containing defective cells or bits are first identified by probing the memory. Control circuit 54 is then programmed to store information identifying which of the 2,048 columns in sections $20_0$-$20_{31}$ contains defective cells. Control circuit 54 receives column address signals A0-A5 and decoded address signals SADEC0-SADEC3, which correspond to column address signal A6 in the by 16 configuration and to column address signals A6, A7 in the by 8 configuration, and in response produces control signals CREDON, IORSA0,1_-IORSA30,31_, and IOMSA0_-IOMSA31_.

When received address signals A0-A5 and decoded address signals SADEC0-SADEC3 correspond to non-defective columns at all bit positions, signal CREDON has a logic "0" level and signals IORSA0,1_-IORSA30,31_ have logic "1" levels. In the by 8 configuration, those 8 of the 32 signals IOMSA0_-IOMSA31_ which are associated with enabled sense amplifier/program circuits 32 have logic "1" levels (e.g. signals IOMSA0_, IOMSA4_, IOMSA8, ..., IOMSA28) and the remaining signals have logic "0" levels. In the by 16 configuration, those 16 of the 32 signals IOMSA0_-IOMSA31_ logic "1" levels (e.g. signals IOMSA0_, IOMSA2_, IOMSA4_, IOMSA30) and the remaining signals have logic "0" levels.

In response to signal CREDON having a logic "0" level, redundant data-in circuit 48 and redundant sense amplifier/program circuit 33 are disabled to prevent data in any input buffer $46_0$-$46_{15}$ from being programmed into a cell in the redundant column in redundant section $20_{RED}$ selected by a decoder 26 in response to address signals A0-A3. In response to signals IORSA0,1_-IORSA30,31_ having logic "1" levels, data-in circuits $44_0$-$44_{15}$ are also disabled to prevent the coupling of input data from input buffers $46_0$-$46_{15}$ to line 50 thus providing additional assurance that data will not be programmed into the selected redundant column.

In addition, multiplexers $56_0$–$56_{15}$ respond to signals IORSA0,1_–IORSA30,31_ having a logic "1" level to prevent data read from the redundant column by redundant sense amplifier/program circuit 33 from being coupled to output buffers $58_0$–$58_{15}$. Multiplexers $56_0$–$56_{15}$ respond to those signals IOMSA0_–IOMSA31_ having a logic "0" level to couple data read from an associated sense amplifier/program circuit 32 to output buffers $58_0$–$58_{15}$. Multiplexers $56_0$–$56_{15}$ respond to those signals IOMSA0_–IOMSA31_ having a logic "1" level to prevent data read from an associated sense amplifier/program circuit 32 from being coupled to output buffers $58_0$–$58_{15}$.

When received address signals A0–A5 and decoded address signals SADEC0-SADEC3 correspond to a defective column, control circuit 54 produces a control signal CREDON having a logic "1" level. In addition control circuit 54 produces for the single multiplexer 56 associated with the defective column a control signal IORSA_ having a logic "0" level and control signals IOMSA_ having a logic "1" level. For the remaining multiplexers 56, all of which contain nondefective columns at the address identified by address signals A0–A5 and decoded address signal SADEC0-SADEC3, control circuit 54 produces control signals IORSA_ having a logic "1" level and control signals IOMSA_ having logic levels determined in the same manner as when a nondefective address is received.

The data in circuit 44 at the bit position having the defective column, in response to control signal IORSA_ having a logic "0" level, couples data received from an input buffer 46 to line 50. Redundant data-in circuit 48 and redundant sense amplifier/program circuit 33 are enabled by the CREDON signal having a logic "1" level to couple line 50 to line 31 to permit the selected cell in the redundant column to be programmed in accordance with the input data.

The multiplexer 56 associated with the defective column, in response to control signal IORSA_ having a logic "0" level and signals IOMSA_ having a logic "1" level, couples the data read by redundant sense amplifier/program circuit 33 to output buffer 58. The remaining multiplexers 56 couple output lines 38 of those sense amplifier/program circuits 32 which are associated with control signals IOMSA_ having a logic "0" level to output buffers 58.

Figure 4:
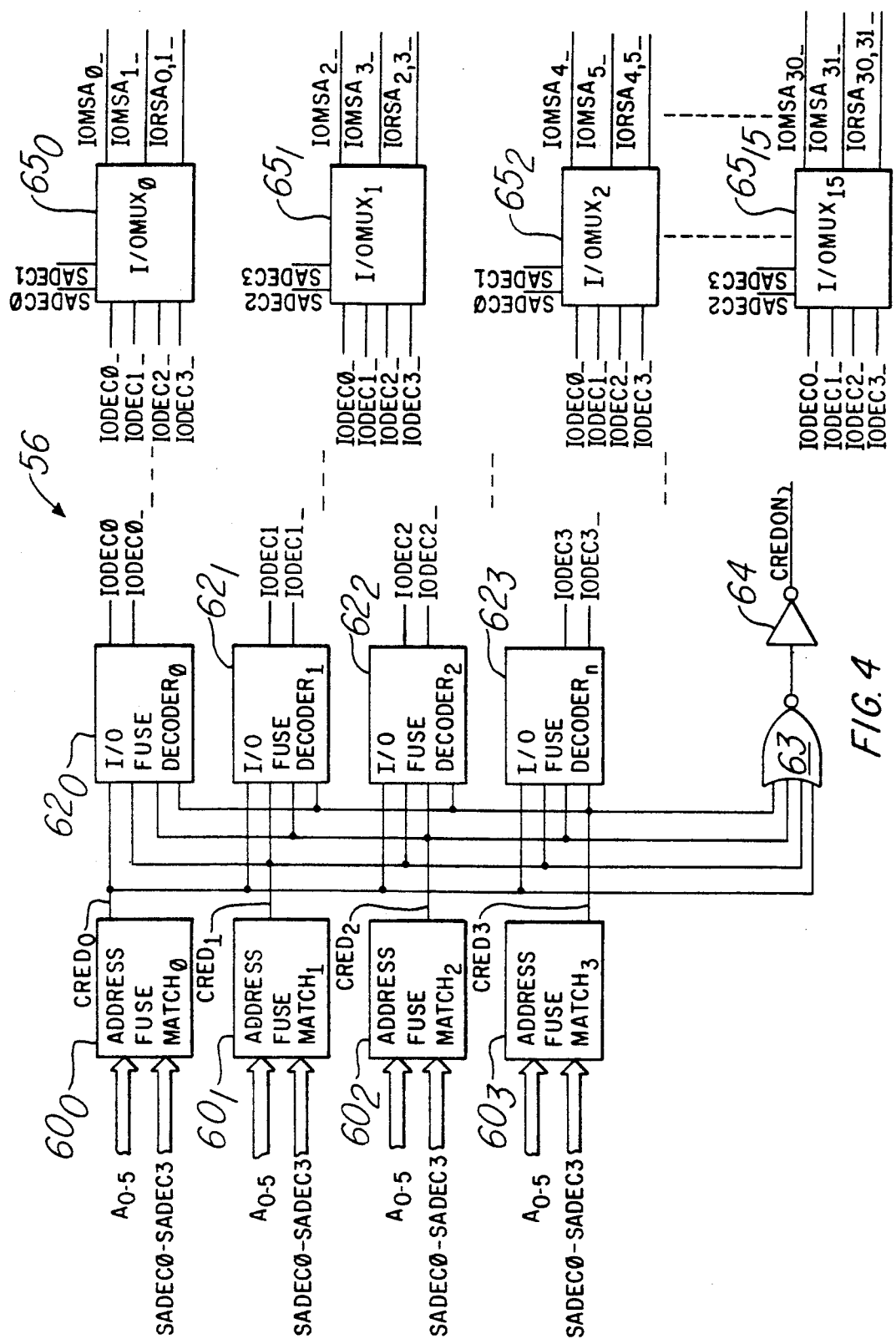
FIG. 4 is a detailed block diagram of the column redundancy control circuit of FIG. 3b.

FIG. 4 is a detailed block diagram of the column redundancy control circuit 54 of FIG. 3b. Control circuit 54 includes address fuse match logic circuits $60_0$–$60_3$. Each one of logic circuits $60_0$–$60_3$ contains fuse logic which can be programmed to store the addresses of a plurality of defective columns. Logic circuits $60_0$–$60_3$ receive column address signals A0–A5 and decoded column address signals SADEC0-SADEC3 and produce signals CRED0-CRED3, respectively, which indicate whether or not the received column address matches a stored address and thus identifies a defective column. A logic circuit 60 produces a signal CRED having a logic "1" level when the received address signals match an address stored in that logic circuit 60 and a logic "0" level when the received address signals do not match any of the stored addresses.

NOR gate 63 has inputs connected to logic circuits $60_0$–$60_3$ to receive signals CRED0-CRED3 and an output connected to inverter 64. Inverter 64 produces an output signal CREDON which has a logic "1" level when any one of signals CRED0-CRED3 has a logic "1" level indicating a received address matches the address of a defective column.

I/O fuse decoder circuits $62_0$–$62_3$ are also connected to logic circuits $60_0$–$60_3$ to receive signals CRED0-CRED3. I/O fuse decoder circuits $62_0$–$62_3$ contain fuse logic which is programmed to identify the bit position of defective column addresses stored in address fuse match logic circuits $60_0$–$60_3$ in response to signals CRED0-CRED3. Each I/O fuse decoder circuit 62 produces a control signal IODEC and its complement IODEC_ in response to signals CRED0-CRED3.

I/O multiplexer control circuits $65_0$–$65_{15}$ receive different combinations of control signals IODEC0-IODEC3 and their complements IODEC0_-IODEC3_. Each one of I/O multiplexer control circuits $65_0$–$65_{15}$ is associated with input and output buffer pairs $46_0$ and $58_0$, $46_1$ and $58_1$, ..., $46_{15}$ and $58_{15}$, respectively, and memory array section pairs $20_0$ and $20_1$, $20_2$ and $20_3$, ..., $20_{30}$ and $20_{31}$, respectively. Each multiplexer control circuit 65 controls whether a column from its associated pair of memory sections 20 or a redundant column from section $20_{RED}$ will be coupled to its associated input and output buffers, 46 and 58. If one of signals CRED0-CRED3 has a logic "1" level indicating that a defective column address match has occurred, that one of the I/O multiplexer control circuits $65_0$–$65_{15}$ associated with the array section 20 containing the defective column will receive a combination of IODEC control signals from I/O fuse decoder circuits $62_0$–$62_3$ indicating a redundant column should be substituted for the defective column. That I/O multiplexer control circuit 65 will produce signal IORSA_ having a logic "0" level and a pair of signals IOMSA_ having logic "1" levels.

Figure 5:
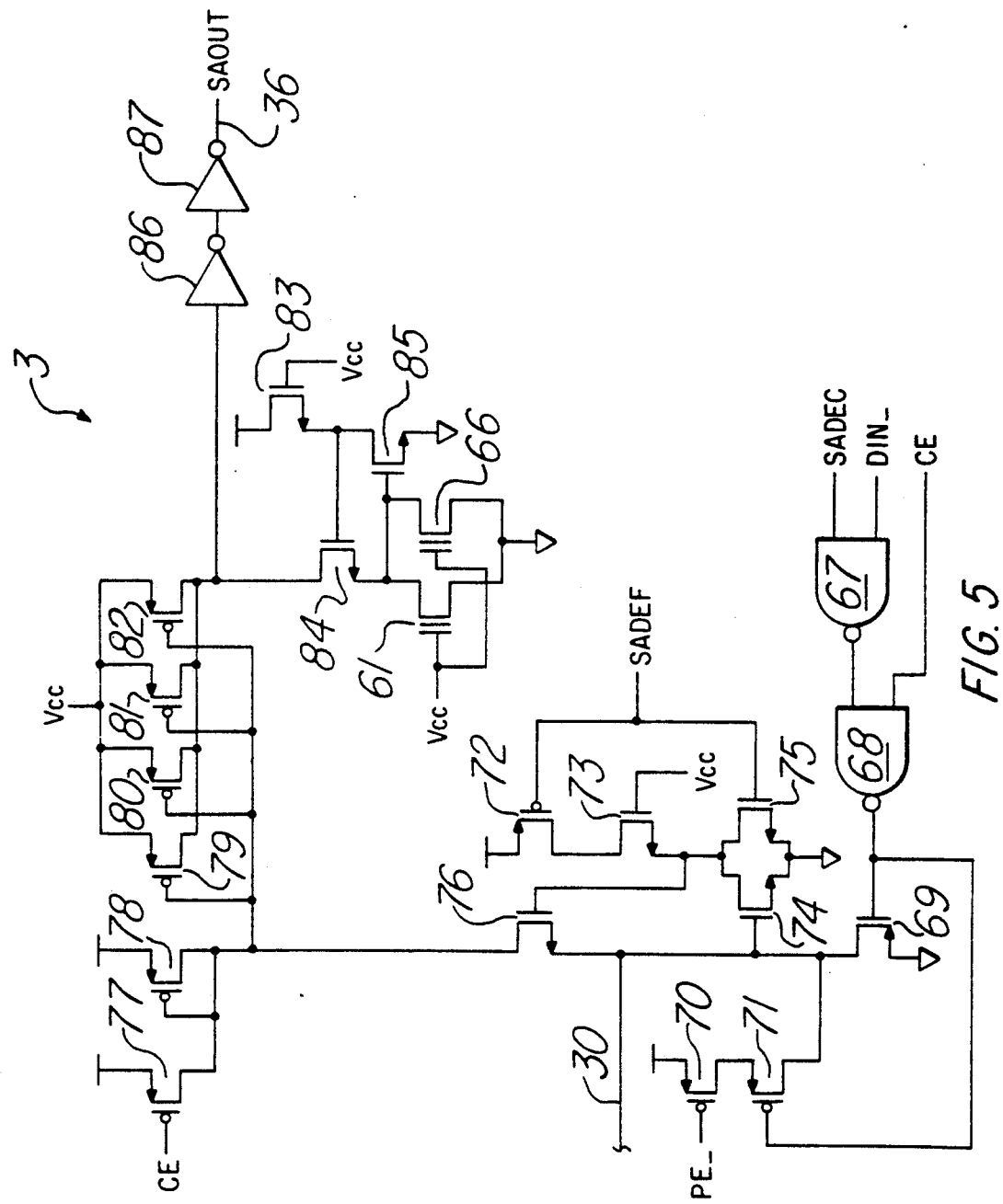

FIG. 5 is an electrical schematic diagram of a sense amplifier/program circuit 32 representative of each of the sense amplifier/program circuits $32_0$–$32_{31}$. In the program mode, a chip enable signal CE having a logic "1" level is applied to NAND gate 68, a sense amplifier defeat signal SADEF having a logic "0" level is applied to the gate of transistors 72 and 75, and a program enable complement signal PE_ having a logic "0" level is applied to the gate of transistor 70. The logic "0" level of signal SADEF disables a bias circuit made up of transistors 72-76 which normally biases line 30 in the read mode. If the sense amplifier decode signal SADEC, which is one of signals SADEC0-SADEC3 produced by sense amplifier decoder 40, received by NAND gate 67 is a logic "1" level then the selected memory cell coupled to line 30 will be programmed in response to the data in complement signal DIN_ received from data in circuit 44.

If signal DIN_ has a logic "0" level, NAND gate 68 will supply a logic "0" level signal to the gates of transistors 69 and 71 to turn them off and on, respectively. Line 30 will then be coupled to the positive voltage source Vcc through transistor 71 and transistor 72, which is on in response to signal PE_. Line 30 applies a positive voltage to the source of the selected memory cell which prevents the floating gate from being programmed to store a "0" value despite programming voltage being applied to the gate of the memory cell. The memory cell thus remains at a "1" value.

If signal DIN has a logic "1" level, NAND gate will supply a logic "1" level signal to the gates of transistors 69 and 71 to turn them on and off, respectively. Line 30 will then be coupled to ground through transistor 69. With the source of the selected memory cell coupled to ground by way of line 30, programming voltages applied to the drain and gate of the memory cell permit the cell to be programmed to store a "0" value.

In the read mode, signal PE_ is a logic "1" level to turn transistor 70 off and inhibit programming. Signal CE is a logic "1" level to turn transistor 77 off and signal SADEF is a logic "0" level enabling the bias circuit made up of transistors 72-76 to bias line 30. As a result, transistor 78 is saturated to set gate to source voltages for transistors 79-82. If the selected memory cell coupled to line 30 stores a "1" value, it will be conductive and current will flow on line 30. Transistors 79-82 act as a current mirror to provide approximately four times the current on line 30 to a node S. A reference circuit made up of transistors 61, 66, and 83-85 is unable to conduct all of the current from transistors 79-82 causing node S to go high. Inverters 86 and 87 will then produce a sense amp output signal SAOUT having a logic "1" level. If the selected memory cell coupled to line 30 stores a "0" value, it will be nonconductive and no current will flow on line 30. Transistors 83-85 will then pull node S low and inverters 86 and 87 will produce a signal SAOUT having a logic "0" level.

Figure 6:
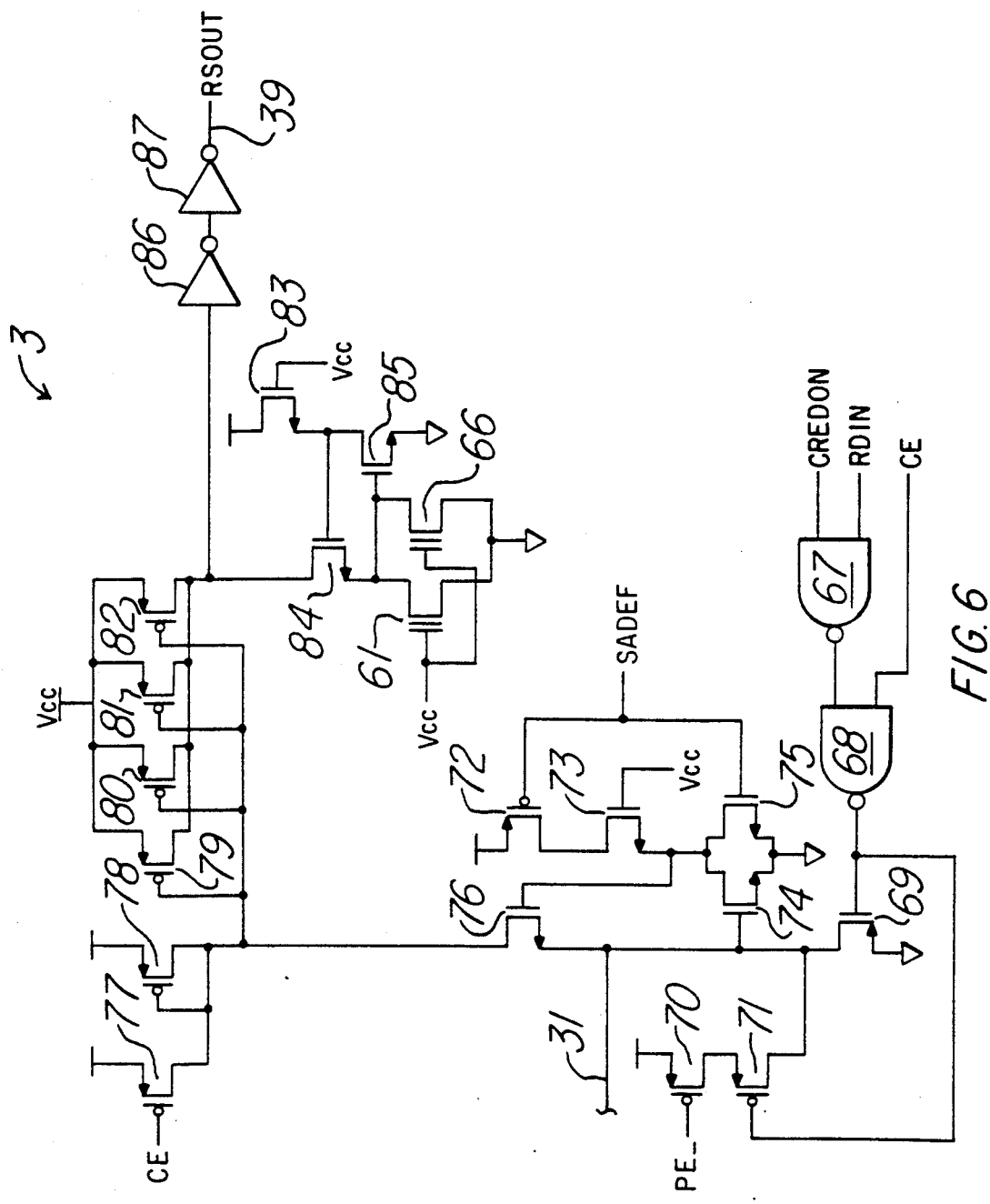

FIG. 6 is an electrical schematic diagram of redundant sense amplifier/program circuit 33. Sense amplifier/program circuit 33 is identical to sense amplifier/program circuits 32 with the exception that NAND gate 67 receives signal CREDON from column redundancy control circuit 54 and redundant data in complement signal RDIN_ from redundant data circuit 48 instead of signals SADEC and DIN_, respectively. As a result, programming of a selected memory cell coupled to line 31 in response to signal RDIN_ is enabled only when a defective column has been addressed as indicated by a logic "1" level of signal CREDON.

Figure 7:
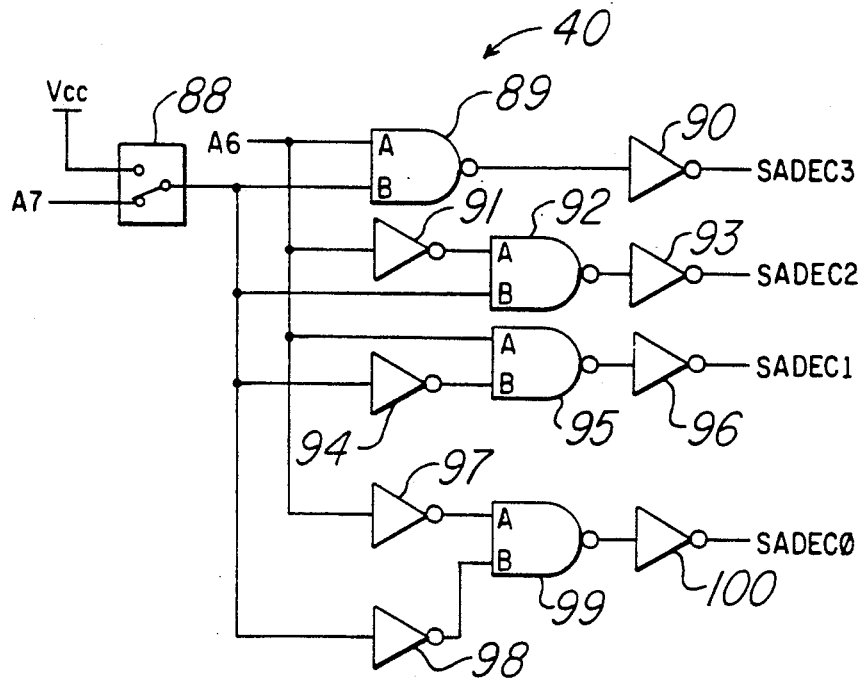

FIG. 7 is an electrical schematic diagram of sense amplifier decoder 40. Decoder 40 has a switch 88 which is connected to address signal A7 to configure the EPROM as a by 8 memory (i.e. 8 bit bytes) or to positive voltage source +V to configure the EPROM as a by 16 memory (i.e. 16 bit bytes). When switch 88 is connected to address signal A7 decoder 40 decodes both address signals A6 and A7 and provides four output signals SADEC0-SADEC3, one of which is a logic "1" level and the remaining three are logic "0" levels. For example, when both address signals A6 and A7 are logic "1" level NAND gate 89 and inverter 90 produce output signal D having a logic "1" level. Inverter 91, NAND gate 92, and inverter 93 produce output signal SADEC2 having a logic "0" level. Inverter 94, NAND gate 95, and inverter 96 produce output signal SADEC1 having a logic "0" level. Inverters 97, 98, NAND gate 99, and inverter 100 produce an output signal A having a logic "0" level. In the by 8 configuration therefore, only one of every four sense amplifier/program circuits 32 is enabled to program a selected memory cell.

When switch 88 is connected to positive voltage source +V, decoder 40 decodes only address signal A6 and provides four output signals SADEC0-SADEC3, two of which are logic "1" levels and the other two are logic "0" levels. For example, when address signal A6 is a logic "1" level NAND gate 89 and inverter 90 produce output signal D having a logic "1" level and inverter 94, NAND gate 95, and inverter 96 produce output signal SADEC1 having a logic "1" level. Inverter 91, NAND gate 92, and inverter 93 produce output signal SADEC2 having a logic "0" level and inverters 97, 98, NAND gate 99, and inverter 100 produce an output signal A having a logic "0" level. In the by 16 configuration therefore, every other one sense amplifier/program circuits 32 is enabled to program a selected memory cell.

Figure 8:
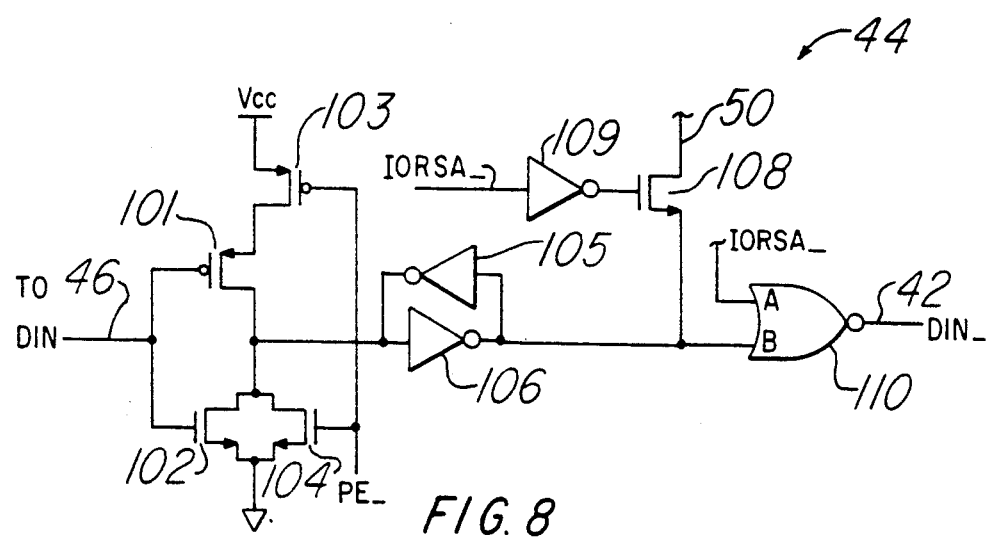
FIG. 8 is an electrical schematic diagram of a data-in circuit of FIG. 3b.

FIG. 8 is an electrical schematic diagram of a data-in circuit 44 which is representative of each of data in circuits $44_0$-$44_{15}$. Data in circuit 44 is enabled only in the program mode to pass data received from input buffer 46 to either a pair of sense amplifiers 32 or to redundant data-in circuit 48 in response to control signal IORSA_ from column redundancy control circuit 54.

In the program mode, signal PE_ is a logic "0" level to turn transistor 103 on and transistor 104 off thus enabling an inverter made up of transistors 101 and 102 to supply the complement of input signal DIN to the input of inverter 106. The output of inverter 106 is connected to the source of transistor 108 and to a first input of NOR gate 110. An inverter 105 is connected in parallel with inverter 106 to provide hysteresis. Control signal IORSA_ is applied via inverter 109 to the gate of transistor 108 and the second input of NOR gate 110. When signal IORSA_ is a logic "1" level indicating that the addressed columns in the two portions of the array associated with the data in circuit 44 are nondefective, transistor 108 is turned off. As a result, the output signal of inverter 106 is not supplied to redundant data circuit 48 over line 50 to prevent programming of the selected redundant memory cell. NOR gate 110, in response to signal IORSA_ having a logic "1" level, produces an output signal DIN_, which is the complement of input signal DIN and is supplied to a pair of sense amplifiers 32 to program a selected memory cell.

When signal IORSA_ is a logic "0" level indicating that an addressed column associated with the data in circuit 44 is defective, transistor 108 is turned on. As a result, the output signal of inverter 106 is supplied to redundant data circuit 48 over line 50 for programming of the selected redundant memory cell. NOR gate 110, in response to signal IORSA_ having a logic "0" level, produces an output signal DIN_ having a logic "0" level irrespective of the level of input signal DIN.

Figure 9:
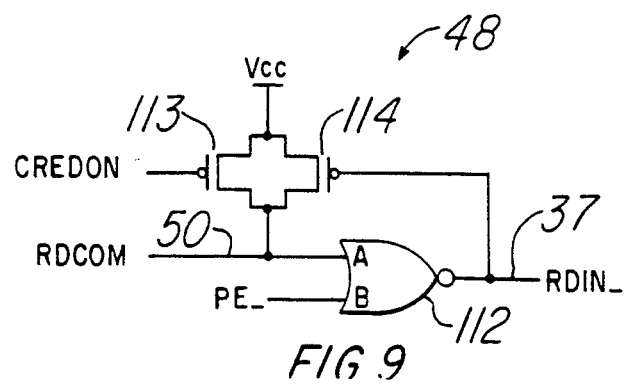
FIG. 9 is an electrical schematic diagram of the redundant data-in circuit in FIG. 3b.

FIG. 9 is an electrical schematic diagram of redundant data-in circuit 48. Redundant data circuit 48 includes a NOR gate 112 having a first input which receives program enable complement signal PE_ and a second input which is connected to the sources of transistors 113 and 114 and by way of line 50 to data in circuits $44_0$-$44_{15}$. The drains of transistors 113 and 114 are connected to positive voltage source +V. The gate of transistor 113 receives signal CREDON from column redundancy control circuit 54. The gate of transistor 114 is connected to the output of NOR gate 112. Redundant data-in circuit 48 is enabled only when the EPROM is operating in the program mode and a defective column has been addressed to pass the complement of data received from one of data in circuits $44_0$-$44_{15}$ to redundant sense amplifier 33. Under these circumstances, signal CREDON is a logic "1" level to turn transistor 113 on and signal PE_ is a logic "0" level. In response to a data signal RDCOM having a logic "0" level received over line 50, NOR gate 112 produces an output signal RDIN_ having a logic "1" level which is supplied to the gate of transistor 114 to turn it off and to redundant sense amplifier 33. In response to a data signal RDCOM having a logic "1" level received over line 50, NOR gate 112 produces an output signal RDIN__ having a logic "0" level which is supplied to the gate of transistor 114 to turn it on and to redundant sense amplifier 33.

Figure 10:
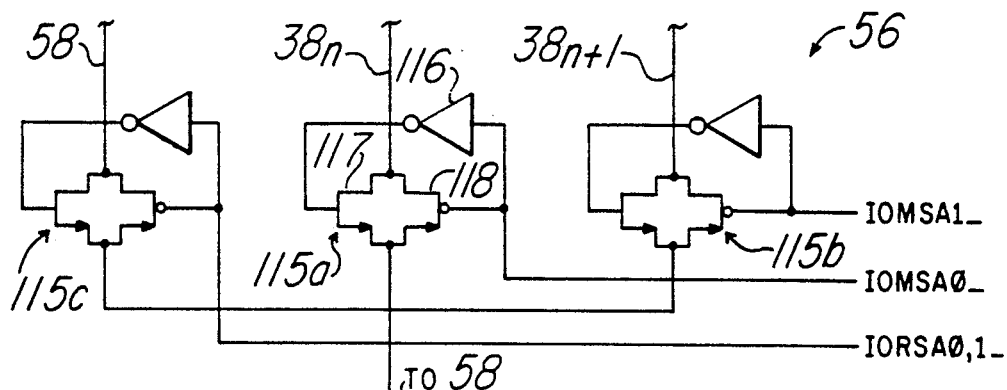
FIG. 10 is an electrical schematic diagram of an output multiplexer of FIG. 3b.

FIG. 10 is an electrical schematic diagram of an output multiplexer 56 which is representative of each of output multiplexers $56_0$–$56_{15}$. Multiplexer 56 includes transmission gates 115a, 115b, and 115c, each of which has an n-channel transistor 117 and a p-channel transistor 118 with current paths connected in parallel and an inverter 116 connected to the gate of transistor 117. The transmission gates are conductive in response to a control signal having a logic "0" level to couple a sense amplifier to output buffer 58 and nonconductive in response to a control signal having a logic "1" level. Transmission gate 115a selectively couples the output of a first sense amplifier 32n (where n is an integer) received on line 38n to output buffer 58 over line 57 in response to control signal IOMSAn__. Transmission gate 115b selectively couples the output of a second sense amplifier 32n+1 received on line 38n+1 to output buffer 58 over line 57 in response to control signal IOMSAn+1__. Transmission gate 115c selectively couples the output of redundant sense amplifier 33 received on line 58 to output buffer 58 over line 57 in response to control signal IORSAn,n+1__.

At any one time, no more than one of control signals IOMSAn__, IOMSAn+1__, and IORSA__ has a logic "0" level so that no more than one of sense amplifiers 32n, 32n+1, and 33 is coupled to output buffer 58. When a nondefective column is addressed, only that transmission gate 115a or 115b which is coupled to the addressed column receives a control signal IOMSA__ having a logic "0" level. When a defective column is addressed, only transmission gate 115c receives a control signal IORSA__ having a logic "0" level.

Figure 11:
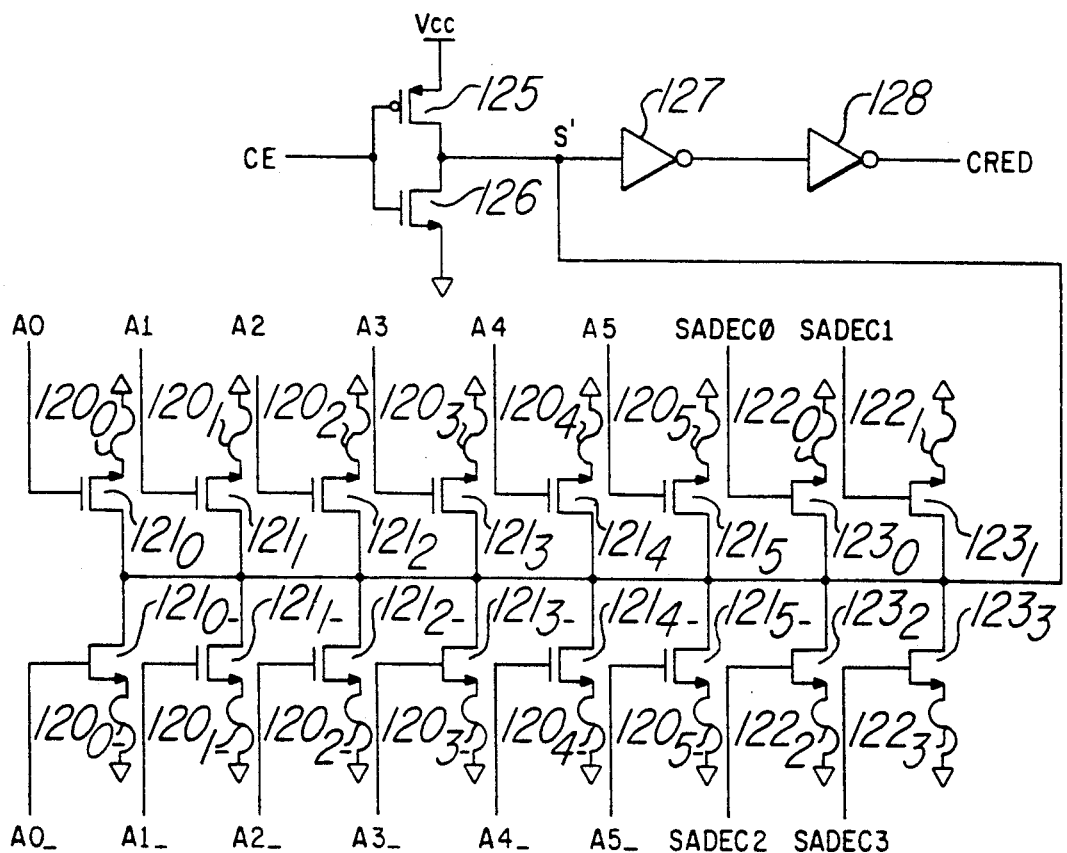
FIG. 11 is an electrical schematic diagram of an address fuse match logic circuit of FIG. 4.

FIG. 11 is an electrical schematic diagram of an address fuse match logic circuit 60 which is representative of each of address fuse match logic circuits $60_0$–$60_3$ in FIG. 4. Circuit 60 includes fuses $120_0$–$120_5$, $120_0$__-$12$-$0_5$__, and $122_0$–$122_3$ which may be programmed, for example by exploding selected fuses using a laser, to store the A0–A7 portion of the address of a plurality of defective columns. Each of transistors $121_0$–$121_5$, $121_0$__-$121_5$__, and $123_0$–$123_3$ has a current path connected between an associated fuse and node S'. Node S' is normally biased high by transistors 125 and 126 which are on and off, respectively, in response to a chip enable complement signal CE__ which has a logic "0" level.

Address signals A0–A5 are applied to the gates of transistors $121_0$–$121_5$, respectively. The complements of address signals A0–A5, that is A0__-A5__, are applied to the gates of transistors $121_0$__-$121_5$__, respectively. Decoded address signals SADEC0–SADEC3, which correspond to address signal A6 when the EPROM is configured as a by 16 memory or address signals A6 and A7 when configured as a by 8 memory, are applied to the gates of transistors $123_0$–$123_3$. Any one of transistors $121_0$–$121_5$, $121_0$__-$121_5$__, and $123_0$–$123_3$ is on if the address signal applied to its gate has a logic "1" level and off if the address signal has a logic "0" level. If any one of transistors $121_0$–$121_5$, $121_0$__-$121_5$__, or $123_0$–$123_3$ is on and its associated fuse is not open, there will be a current path to ground which will pull node S' low. In response to node S' being pulled low, inverters 127 and 128, which are connected in series to node S' will produce signal CRED having a logic "0" level.

Before address fuse match logic circuit 60 is programmed, the EPROM is probed to determine the number and location of any defective columns. Since there are sixteen redundant columns which are selected by a 1 of 16 decoder, if the total number of defective columns is less than 16 and if no two of the defective columns has the same A0–A3 address portion, the EPROM can be repaired by replacing the defective columns with redundant columns.

If repair is possible, the A0–A7 portion of an address of a defective column is programmed in logic circuit 60 by opening those fuses whose associated transistors are on when the A0–A7 portion of the defective column address is received. For example, if the EPROM is operating in a by 8 configuration and the A0–A7 portion of a defective column address is 10000000, then fuses $120_0$, $120_1$__-$120_5$__, and $122_0$ are opened. If address 10000000 is subsequently received by logic circuit 60, since fuses $120_0$, $120_1$__-$120_5$__, and $122_0$ are opened, transistors $121_0$, $121_1$__-$121_5$__, and $123_0$, although on, will not be able to pull node S' low. Logic circuit 60 therefore will produce a signal CRED having a logic "1" level which indicates that the received address is the address of a defective column. If logic circuit 60 receives an address which has not been programmed as a defective address, signal CRED will have a logic "0" level since at least one of the transistors will be on and its associated fuse intact to provide a current path to ground to pull node S' low.

The use of fuses $120_0$__-$120_5$__ associated with address complement signals A0__-A5__ gives each logic circuit 60 the capability of storing more than one defective column address. For example, if two defective columns have A0–A7 address portions 10000000 and 00000001, respectively, then fuses $120_0$, $120_1$__-$120_5$__, and $122_0$ are first opened to program address 10000000 and fuse $122_2$ is subsequently opened to program address 10000001. The maximum number of defective column addresses a logic circuit 60 can store is 16.

Figure 12:
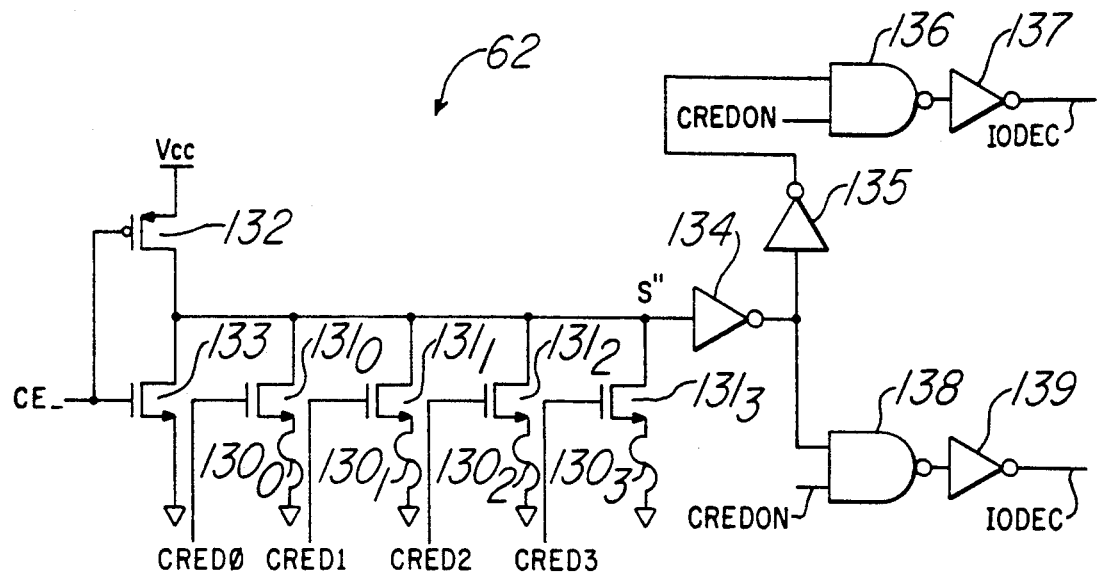
FIG. 12 is an electrical schematic diagram of an I/O fuse decoder circuit of FIG. 4.

FIG. 12 is an electrical schematic diagram of an I/O fuse decoder circuit 62 which is representative of each of I/O fuse decoder circuits $62_0$–$60_3$ in FIG. 4. Decoder circuit 62 includes fuses $130_0$–$130_3$ connected between the source electrodes of transistors $131_0$–$131_3$, respectively, and ground or reference potential. Fuses $130_0$–$130_3$ may be programmed, for example by exploding selected fuses using a laser, to store a single bit of a four bit signal which identifies which one of the sixteen input and output buffers $46_0$–$46_{15}$ and $58_0$–$58_{15}$ a defective column address is associated with. Each of transistors $131_0$–$131_3$ has a current path connected between an associated fuse and node S". Node S" is normally biased high by transistors 132 and 133 which are on and off respectively in to the signal CE__, which is the complement of externally generated chip enable signal CE and has a logic "0" level under normal operating conditions.

Output signals CRED0–CRED3 from address fuse match logic circuits $60_0$–$60_3$ are applied to the gates of transistors $131_0$–$131_3$, respectively. Any one of transistors $131_0$–$131_3$ is on if the signal CRED applied to its gate has a logic "1" level and off if the address signal has a logic "0" level. If any one of transistors $131_0$–$131_3$ is on and its associated fuse is not open, the transistor and its associated fuse will provide a current path to ground which will pull node S" low. In response to node S" being pulled low, series connected inverters 134, 135, NAND gate 136, and inverter 137 will produce signal IODEC having a logic "0" level while series connected inverter 134, NAND gate 138, and inverter 139 will produce signal IODEC_, which is the complement of signal IODEC, having a logic "1" level. If signals CRED0-CRED3 do not turn any of transistors $131_0$-$131_3$ on or if all of the transistors turned on are associated with open fuses, node S" will remain high and signals IODEC and IODEC_ will have logic "1" and "0" levels, respectively.

Each IODEC and IODEC_ signal produced by fuse decoder circuits $62_0$-$62_3$ is used as a single bit having a predetermined position in a four bit signal which identifies the input and output buffers at which a redundant column is to replace a defective column. In the order of most significant to least significant bit in the four bit signal, the signals are arranged as follows: IODEC0 and IODEC0_, IODEC1 and IODEC1_, IODEC2 and IODEC2_, and IODEC3 and IODEC3. There are sixteen combinations of signals IODEC0-3 and IODEC0_-3_ having the bit order described above. As seen in FIG. 4, each of the sixteen multiplexer control circuits $65_0$-$65_{15}$ receives a unique four bit signal.

Each multiplexer control circuit activates its associated multiplexer $56_0$-$56_{15}$ to replace a defective addressed column with a redundant column only when all four bits of the four bit signal have a logic "1" level. Therefore, fuses $130_0$-$130_3$ must be programmed so that when any one of address fuse match logic circuits $60_0$-$60_3$ detects a match between a received address and a stored defective column address, the multiplexer 56 coupled to the array portion in which the defective column is located is activated to replace the defective column with a redundant column.

For example, assume that the column at the A0-A7 address 1000000 in that section 20 of the array associated with multiplexer $56_6$ is defective and that address 1000000 has been programmed into address fuse match logic circuit $60_1$. When A0-A7 address 1000000 is received by address fuse match logic circuits $60_0$-$60_3$, logic circuit $60_1$ will produce signal CRED1 having a logic "1" level while logic circuits $60_0$, $60_2$, and $60_3$ will produce signals CRED0, CRED2, CRED3, respectively, having a logic "0" value. Since I/O multiplexer control circuit $65_6$ receives only IODEC signals IODEC0_, IODEC1, IODEC2, and IODEC3_ and is activated only when these IODEC signals have a logic "1" value, fuses $130_1$ in I/O fuse decoders $62_0$ and $62_3$ must be opened while fuses $130_1$ in I/O fuse decoders $62_1$ and $62_2$ must remain closed to activate control circuit $65_6$. I/O multiplexer control circuit $65_6$ when activated will cause multiplexer $65_6$ to replace the defective column with a redundant column.

Figure 13:
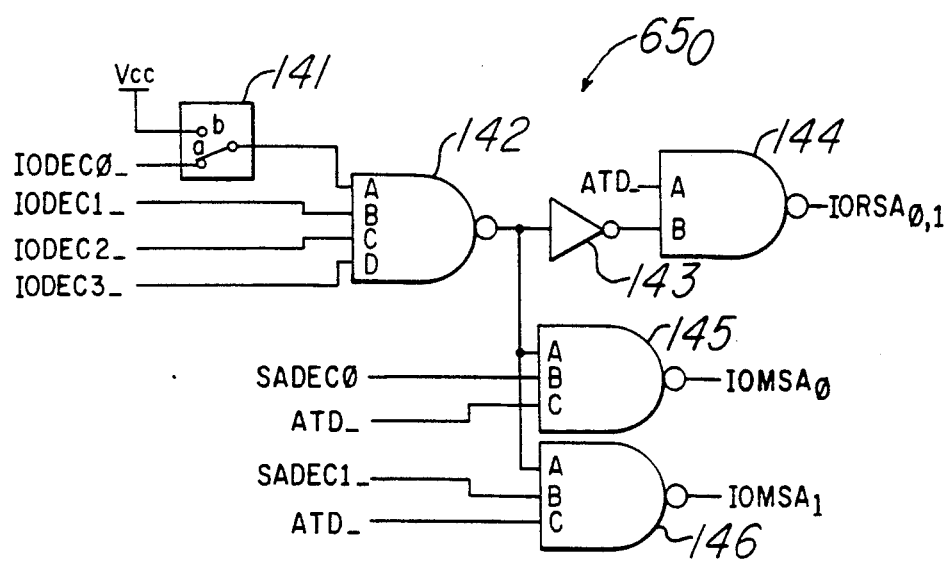
FIG. 13 is an electrical schematic diagram of an I/O multiplexer control circuit of FIG. 4.

FIG. 13 is an electrical schematic diagram of I/O multiplexer control circuit $65_0$ which is substantially identical to I/O multiplexer control circuits $65_0$-$65_{14}$. The only difference between control circuits $65_0$-$65_{15}$ is in the particular combination of IODEC signals received by NAND gate 142 and the particular SADEC signals received by NAND gates 145 and 146. Control circuit $65_{15}$ includes a switch 141 which is in position a when the EPROM is to operate in a by 8 configuration and in position b when the EPROM is to operate in a by 16 configuration. Input A of NAND gate 142 receives either signal IODEC0 when switch 141 is in position a or a positive voltage Vcc when switch is in position b. Inputs B-D of NAND gate 142 receive signals IODEC1-IODEC3, respectively. The output of NAND gate 142 is inverted by inverter 143 and applied to the B input of NAND gate 144. The A input of NAND gate 144 receives an address transition signal ATD_. Signal ATD_ goes from a logic "1" level to a logic "0" level for a predetermined period of time after an address change has occurred to prevent premature data from being applied to output buffer $58_{15}$.

The output of NAND gate 142 is also applied to the A inputs of NAND gates 145 and 146. The B inputs of NAND gates 145 and 146 receive signals SADEC0 and SADEC1, respectively, while the C inputs receive signal ATD_. When signal ATD_ goes from a logic "0" level to a logic "1" level, if signals IODEC0-IODEC3 in the by 8 configuration or signals IDOEC1-IODEC3 in the by 16 configuration all have a logic "1" level indicating the addressed column should be replaced by a redundant column, then NAND gate 144 produces signal IORSA0,1_ having a logic "0" level and NAND gates 145 and 146 produce signals IOMSA0_ and IOMSA1_ having logic "1" levels. Data in circuit $44_0$ is responsive to signal IOMRSA0,1_ having a logic "0" level to pass data from input buffer $46_0$ to redundant data circuit 48. Multiplexer $56_0$ is responsive to signal IORSA0,1_ having a logic "0" level and signals IOMSA0_ and IOMSA1_ having logic "1" levels to pass data from only redundant sense amplifier 33 to output buffer $58_0$.

When signal ATD_ goes from a logic "0" level to a logic "1" level, if any one of signals IODEC0-IODEC3 in the by 8 configuration or signals IDOEC1-IODEC3 in the by 16 configuration is a logic "0" level indicating the addressed column is not defective, then NAND gate 144 produces signal IORSA0,1_ having a logic "1" level. NAND gates 145 and 146, in turn, produce output signals IOMSA0_ and IOMSA1_ which have logic levels equal to the logic levels of input signals SADEC0 and SADEC1. In the by 16 configuration, one of signals SADEC0 and SADEC1 will have a logic "0" level and the other will have a logic "1" level. In the by 8 configuration, one of signals SADEC0-SADEC3 will have a logic "0" level and the remaining signals will have a logic "1" level. Data in circuit $44_0$ is responsive to signal IORSA0,1_ having a logic "1" level to pass data from input buffer $46_0$ to sense amplifiers $32_0$ and $32_1$ while preventing data from passing to redundant data circuit 48. Multiplexer $56_0$ is responsive to signal IORSA0,1_ having a logic "1" level to prevent data from passing from redundant sense amplifier 33 to output buffer $58_0$.

Figure 14:
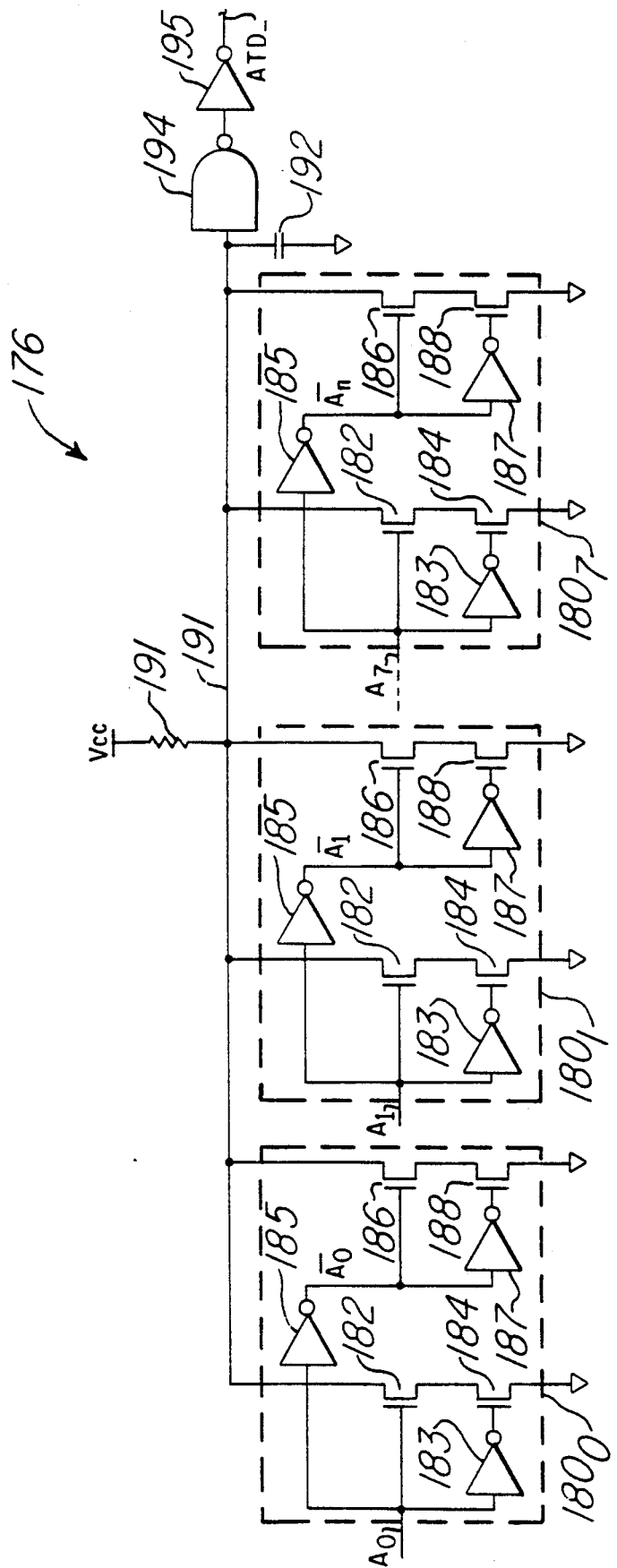
FIG. 14 is an electrical schematic diagram of an address transition detector.

An electrical schematic diagram of address transition detector 176 is shown in FIG. 14. Address transition detector 176 is responsive to address signals $A_0$-$A_7$ and provides an output pulse ATD_ of predetermined width having a logic "0" level when an address change occurs. The width of the pulse is chosen to render transmission gate 115 nonconductive after an address change has occurred only for a time period sufficient to prevent the coupling of premature data from sense amplifier/program circuit 32 to output buffer 58. Address transition detector 176 includes a plurality of modules $180_0$-$180_7$, each of which receives a respective one of the column address signals, $A_0$-$A_7$. Each module 180 has a first pair of n-channel field effect transistors 182 and 184 with source-drain current paths connected in series between node 191 and ground and a second pair of n-channel field effect transistors 186 and 188 with source-drain current paths connected in series between node 191 and ground. The gates of transistors 184 and 188 are connected to the outputs of inverters 183 and 187, respectively. The gate of transistor 182 and the input of inverter 183 are coupled to a respective address line to receive the column address signal A. The gate of transistor 186 and the input of inverter 187 are connected to the respective address line through inverter 18 to receive signal A—, the complement of address signal A. Address transition detector 176 also includes a resistor 190 connected between a source of positive voltage and node 191 and a capacitor 192 connected between node 191 and ground. Inverters 194, 195 are connected to node 191 and produce signal ATD—.

When column address signals $A_0$–$A_7$ are constant, node 191 is at a high potential to provide a signal having a logic "1" level to inverter 194, 195 which produce an output signal ATD— having a logic "1" level in response. The high potential at node 191 when the address signals $A_0$–$A_7$ are constant is due to the fact that one transistor in each of the first pair of transistors 182 and 184 and the second pair of transistors 186 and 188 in each of the modules 180 will be non-conductive allowing capacitor 192 to charge to a logic "1" value.

Inverters 183 and 187 are chosen to have a fast rise time and a slow fall time. As a result of the slow fall time, there is a delay period between the time at which the input changes from a logic "1" level to a logic "0" level and the time at which the output changes from a logic "0" level to a logic "1" level. The delay period resulting from the slow fall time of the inverters is of sufficient length such that when one or more of the bitline address signals $A_0$–$A_7$ changes, the transistors in either the first transistor pair 182, 184 or the second transistor pair 186, 188 will be conductive simultaneously to provide a discharge path to ground for capacitor 192 causing node 191 to go low. For example, if $A_0$ changes from a logic "0" level to a logic "1" level, in module $180_0$ transistor 182 will become conductive while transistor 184 remains conductive during the delay period it takes the output of inverter 183 to change from a logic "1" level to a logic "0" level. Subsequent to the delay period, transistor 184 becomes nonconductive. Likewise, if $A_0$ changes from a logic "1" level to a logic "0" level, in module $180_0$ transistor 186 will become conductive while transistor 188 remains conductive during the delay period it takes the output of inverter 187 to change from a logic "1" level to a logic "0" level. Subsequent to the delay period, transistor 188 becomes nonconductive.

Following the delay period, none of the modules $180_0$–$180_7$ provides a conductive path from node 191 to ground and the potential at node 191 increases at a rate determined by the values of resistor 190 and capacitor 192. When the potential at node 191 reaches a logic "1" level, output signal ATD— of inverter 195 becomes a logic "1" level. In response to an address change, address transition detector 176 thus provides a positive pulse having a predetermined width.

While capacitor 192 has been shown as a discrete element, in some cases a discrete capacitor may not be required since the parasitic capacitance at node 191 may be sufficient to produce a pulse having the necessary width. Additional modules 180 may also be provided in address transition detector 176 to detect wordline address changes in addition to column address changes. In addition, A6 and A7 may be replaced with SADEC signals, such as SADEC0 and SADEC3.

Figure 15:
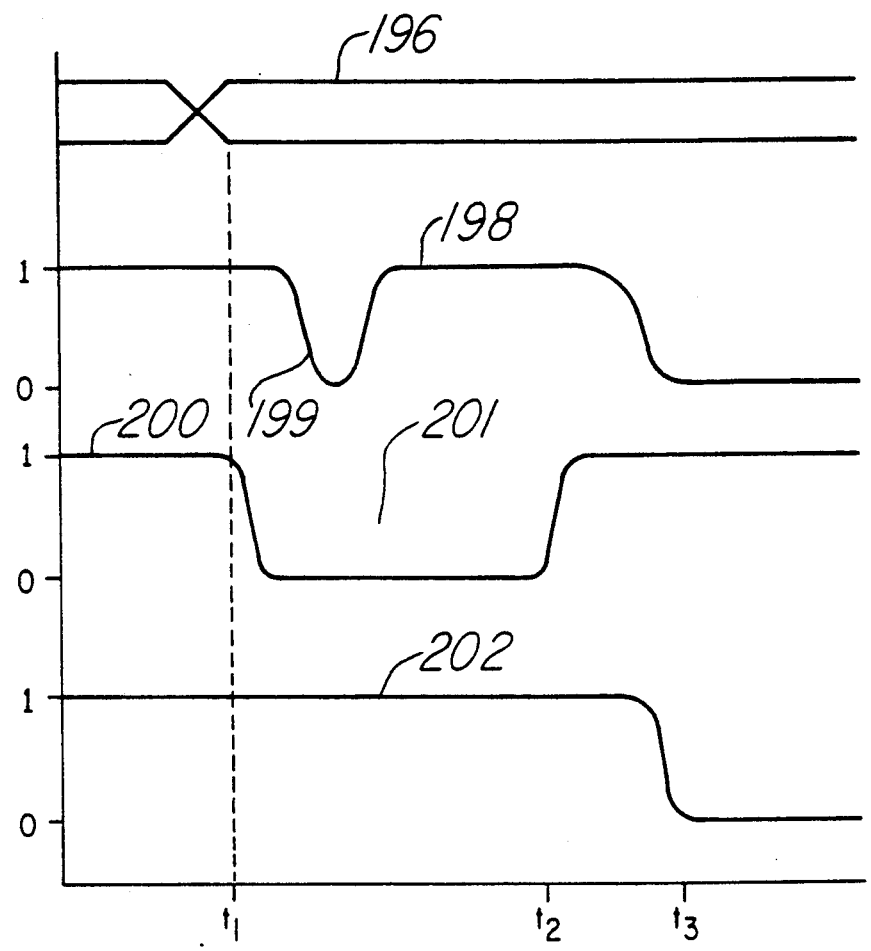
FIG. 15 shows waveforms illustrating the operation of the address transition detector of FIG. 14.

FIG. 15 shows waveforms present in the EPROM of FIG. 3a and 3b during a read operation. Column address signals $A_0$–$A_7$ are shown at 196 with an address change for selecting a newly desired cell being completed at time t1.

The output of sense amplifier/program circuit 32 is shown at 198. Prior to completion of the address change at t1, the previously selected cell was conductive and therefore sensed as storing data having a logic "1" level. Following completion of the address change at t1, sense amplifier/program circuit 32 detects premature data 199 which results from the fact that the row decoding process and the column decoding process are not completed simultaneously. Following completion of the row and column decoding processes at t3, sense amplifier/program circuit 32 senses data having a logic "0" level stored in the newly selected cell.

The output signal of address transition detector 17 is shown at 200. This output signal has a logic "1" level until address transition detector 176 detects the column address change at time t1 at which time a pulse 201 having a logic "0" level is produced. Transmission gate 115 is responsive to pulse 201 to disconnect sense amplifier/program circuit 32 from output buffer 58. Pulse 201 has a predetermined width from time t1 to t2 which is sufficient to mask out premature data 199 detected by sense amplifier/program circuit 32 from output buffer 58.

The data out signal produced by output buffer 58 is shown at 202. Up to time t1, output buffer 58 receives the logic "1" level output signal from sense amplifier/program circuit 32 by way of transmission gate 115 and produces a data out signal. From time t1 to t2, the output of sense amplifier/program circuit 32 is disconnected from the output buffer 58. During this time period, the input to output buffer 58 is latched at its level immediately prior the disconnection of sense amplifier/program circuit 32 by latch 203. The data out signal from output buffer 58 therefore remains at its previous level, in this case the logic "1" level, and is thereby masked from any premature data sensed by sense amplifier/program circuit 32. After time t2, transmission gate 115 connects sense amplifier/program circuit 32 to output buffer 58 permitting the data out signal to once again follow the output signal of sense amplifier/program circuit 32.

As can be seen in FIG. 15, address transition detector 176 and transmission gate 115 cooperate to mask out premature data from the output buffer 58. The noise and associated impairment of the memory device's speed resulting from premature data being provided at output buffer 58 are thereby effectively eliminated.

Although the present invention has been described as applied to an EPROM, it is equally applicable to other forms of memories including EEPROMs, PROMs, SRAMs, and DRAMs.

We claim:

1. A memory, comprising:
   an array of memory cells arranged in a plurality of rows and columns, said columns being arranged in a plurality of subarrays;
   a plurality of column decoder circuits, each said column decoder circuit selecting a single column out of the columns in said subarray in response to a column address signal;
   a plurality of redundant columns;
   a redundant column decoder for selecting a single redundant column in response to at least a portion of said column address signal;
   an input buffer and an output buffer for each of said subarrays, each input buffer and output buffer being connectable to a said column in said subarray;

a plurality of switching means, each switching means coupling a said input and a said output buffer either to a selected column in response to first control signals or to a selected redundant column in response to second control signals; and a control circuit for storing the addresses of defective columns and information identifying the input and output buffers capable of coupling each defective column, said control circuit supplying first control signals to all of said switching means when a received column address signal does not match a stored address and supplying second control signals to said switching means capable of coupling each said defective column and first control signals to the remaining switching means when a received column address matches a stored address.

2. The memory of claim 1 in which each of said switching means comprises a data-in switching circuit for selectively coupling either a selected column or a selected redundant column to said associated input buffer and a multiplexer for selectively coupling either a selected column or a selected redundant column to said associated output buffer.

3. The memory of claim 1 in which said control circuitry comprises a plurality of address match circuits, each address match circuit having logic for storing the address of at least one defective column and producing signals indicating whether a received address matches a stored address.

4. The memory of claim 3 in which said control circuitry further comprises a plurality of input/output decoder circuits, each input/decoder circuit receiving said signals produced by said address match circuits and producing a pair of signals in response.

5. The memory of claim 4 in which said control circuitry further comprises a plurality of logic circuits, each of said logic circuits receiving a different combination of signals from said input/output decoder circuits and in response supplying either said first control signals or said second control signals to an associated switching means, said combination of signals including a single signal from each of said input/output decoder circuits.

* * * * *